United States Patent

Aufreiter et al.

[11] Patent Number: 5,853,479
[45] Date of Patent: Dec. 29, 1998

[54] APPARATUS FOR DRAWING SINGLE CRYSTALS BY THE CZOCHRALSKI METHOD

[75] Inventors: Joachim Aufreiter, Alzenau; Dieter Brüss, Bruchköbel; Burkhard Altekrüger, Alzenau, all of Germany

[73] Assignee: Balzers und Leybold, Hanau am Main, Germany

[21] Appl. No.: 759,975

[22] Filed: Dec. 3, 1996

[30] Foreign Application Priority Data

Dec. 27, 1995 [DE] Germany ............... 195 48 845.8

[51] Int. Cl.⁶ ................................................ C30B 35/00
[52] U.S. Cl. ................... 117/201; 117/202; 117/208
[58] Field of Search ................. 117/13, 14, 15, 117/201, 202, 203, 208, 900

[56] References Cited

U.S. PATENT DOCUMENTS

| | | | |
|---|---|---|---|
| 3,692,499 | 9/1972 | Aindrychuk | 117/14 |
| 4,634,490 | 1/1987 | Tatsumij et al. | 117/14 |
| 5,240,684 | 8/1993 | Baba et al. | 117/14 |
| 5,776,787 | 1/1993 | Kawashima et al. | 117/208 |

FOREIGN PATENT DOCUMENTS 363239181A 10/1988 Japan ............... 117/14
402014892A 1/1990 Japan ............... 117/14

OTHER PUBLICATIONS

Patent Abstracts of Japan; JP 2–164789A filed Jun. 25, 1990; Appln No: JP 63–316224 filed Dec. 16, 1988; Assignee: Komatsu Denshi Kinzoku KK; Inventor: Yoshinobu Hiraishi; Title: Automatic Control Device for Diamete of Single Crystal.

Patent Abstracts of Japan; JP 57–179097A filed Nov. 4, 1982; Appln No: 56–63247 filed Apr. 28, 1981; Assignee: Tokyo Shibaura Denki KK; Inventor: Shinichirou Takasu; Title: Method and Apparatus for Growing Single Crystal.

*Primary Examiner*—Felisa Garrett
*Attorney, Agent, or Firm*—Fulbright & Jaworski, LLP

[57] ABSTRACT

An image of the meniscus ring (21) between the crystal (20) and the melt (4) is formed by optical means (12, 24) on a sensor, the signals of which yield the actual value for the diameter of the crystal. Two optical measuring devices are provided, the optical paths of which are defined by base points on the meniscus ring (21) and two planes which are offset by 90° to each other and which are parallel to the main axis of the crystal and in tangential contact with the meniscus ring (21). The two optical paths are preferably set up to intersect, their intersection being in the viewing window.

8 Claims, 3 Drawing Sheets

APPARATUS FOR DRAWING SINGLE CRYSTALS BY THE CZOCHRALSKI METHOD

BACKGROUND OF THE INVENTION

The invention pertains to an apparatus for drawing single crystals from a melt in a crucible under vacuum or protective gas by the Czochralksi method, wherein optical means form an image of the meniscus ring between the crystal and the melt or sections thereof on a sensor, the signals of which are electronically processed to yield an actual value for the diameter of the crystal. The difference between the actual value and the nominal value is sent as the deviation to a controller, to which actuators are connected for controlling the diameter.

In the Czochralski method, a seed crystal is dipped into the melt of the material to be drawn, usually Si, and pulled back out as it is being rotated and simultaneously cooled to obtain a single crystal with a defect-free crystal structure of the highest purity. The nominal diameter of the single crystals drawn in production today depends on the size of the wafers processed in semiconductor technology. In spite of the advances in the miniaturization of electronic components, these wafers are becoming larger and larger in stages for economic reasons. Today their diameters are primarily in the range of 150–200 mm.

For the next generation of semiconductor fabrication facilities, plans already call for wafers with a diameter of 300 mm. And there is already talk of diameters of 400 mm for plants now in the development phase. At these dimensions for perfect single crystals, not only the structure and purity of the crystal but also the uniformity of the diameter along the cylindrical crystal are important. The smoother the cylinder wall, the less the processing work and the smaller the loss of material. For this reason, control of the diameter during the drawing process is an important economic criterion.

Conventional drawing systems for crystals with diameters of 150 and 200 mm are usually equipped with automatic diameter control devices. The diameter of the crystal is detected by suitable electro-optic measuring devices and adjusted by suitable actuators as a function of the heating power, the drawing rate, and the rotational speed to maintain a constant nominal diameter. The variation in. the diameter over the length of the crystal, the so-called "ribble", which is usually in the range of 1–3% of the diameter, reflects the accuracy of the control device.

See, for example, K. Th. Wilke and J. Bohm, Kristall-Z uchtung [Crystal Growth], p. 723 ff., for a general overview of the control methods used in the Czochralski method.

Many different electro-optic measuring devices have been proposed to measure the diameter. Common to all of them is the formation of an optical image of the so-called "meniscus" on a suitable sensor, the signals of which are then processed to yield a value representing the diameter. The meniscus is a narrow, ring-shaped zone between the solidified crystal and the liquid Si melt, which is noticeably brighter than the melt itself. The crystal appears surrounded by a bright ring at the crystal-melt interface. This phenomenon, which is difficult to explain optically, is caused when the radiation coming primarily from the crucible wall is reflected from the concave transition between the melt and the crystal. As a result, an observer looking down onto the melt and the immersed crystal from above sees a relatively dark crystal, surrounded at the level of the melt by a bright, luminous ring. During the course of the drawing process, the ring widens by a factor of about 3 as the level of the melt falls in the crucible and as the growing crystal rises from it. This makes it increasingly more difficult, toward the end of the drawing process, to determine the diameter precisely by forming an image of the luminous ring on a suitable sensor.

DE-OS 21 49 093 describes a simple measuring setup, in which the beam of light from an incandescent lamp or a laser is directed onto the meniscus ring practically parallel to the main axis of the single crystal; this light then forms an optical image on two photodiodes. By means of suitable circuitry, the difference signal of the diodes can be used to control the diameter.

In U.S. Pat. No. 3,740,563, the light beam reflected from the meniscus ring is allowed to form an image on the surface of a multi-part sensor and thus divided in such a way that a shift of the measuring surface in the y direction indicates a change in the diameter of the crystal, whereas a change in the x direction indicates a change in the level of the melt bath.

More recent applications such as, for example, EP 0 454 389 and EP 0 450 502 take advantage of the possibilities of video cameras and describe electronic evaluation methods for determining the crystal diameter.

Common to all these measurement devices is that the one-dimensional or two-dimensional image of the meniscus ring or, more accurately, of the visible part of the ring, is produced by an objective or a lens, where, because of the heating components and the crucible inserts, observations must be made downward from above at an angle of approximately 5–30°.

For crystal diameters of up to 200 mm, variations in diameter of approximately ± 2% over the length of the crystal can be achieved with measuring devices such as these. For even larger diameters, however, problems arise on principle. In conventional drawing systems, the diameter of a 100-mm crystal in the area of the meniscus is seen through the viewing window (FIG. 1) at an aperture angle of approximately 8°. Although crystals with a diameter of 300 mm are drawn in larger containers, the image distance is not 3 times greater. The diameter of a 300-mm crystal appears through the viewing window at an aperture angle which is approximately 2.5 times larger, that of a 400-mm crystal at an aperture angle which is already more than 3 times larger. Because of the unfavorable viewing angle, larger and larger parts of the outer meniscus ring are covered by the crystal as the crystal diameter increases. This effect can become even worse when the diameter control system malfunctions and a bead is allowed to form on the diameter. Because the projecting bead conceals the outer boundary of the ring, the electronic evaluation unit displays an incorrect diameter. In unfavorable viewing directions at a large aperture angle, furthermore, the intensity and the contrast of the meniscus ring decrease toward the sides. For the sake of contrast, the end-on viewing direction in the plane of the main crystal axis would be the best. But disadvantages are also associated with this viewing direction.

In cases where the crystal necks down, the meniscus ring will be concealed by the crystal growing up out of the melt when viewed from above. In the extreme case, no actual value at all will be detected for use by the control system.

The end-on viewing direction is also unfavorable in situations where it is possible for the crystal to oscillate as a result of, for example, inaccurate centering, temperature effects, or growth defects, because a local displacement of the meniscus ring can be the result of either a change in diameter or an oscillating motion. These two causes cannot be distinguished from each other when the crystal is viewed from this direction.

SUMMARY OF THE INVENTION

The invention provides a measuring apparatus for drawing processes based on the Czochralski method by means of which crystal diameters of more than 200 mm can be monitored and controlled with satisfactory accuracy.

To detect the crystal diameter, an image of the meniscus ring is produced by optical means in two different optical paths or viewing directions on associated sensors, and the main axes of the viewing directions have their base points on the meniscus ring and extend in two planes offset from each other preferably by 90°, these planes being largely parallel to the main axis of the crystal and in tangential contact with the meniscus ring. The angle between the viewing direction and the main crystal axis is predetermined by the position of the viewing window and is approximately 20–30°.

The viewing directions, which are offset by 90° to each other, can be realized either with two separate viewing windows or with a single viewing window with intersecting viewing directions.

The following advantages are provided by this arrangement:

The meniscus ring always remains visible even if the diameter experiences significant changes. In contrast to the end-on viewing direction, the proposed apparatus yields the actual value for the true crystal diameter.

Because of the 90° offset of the measuring setup, the apparatus is able to distinguish between the oscillation of the crystal and a change of diameter.

DETAILED DESCRIPTION OF THE PREFERRED EMBODIMENTS

Figure 1:
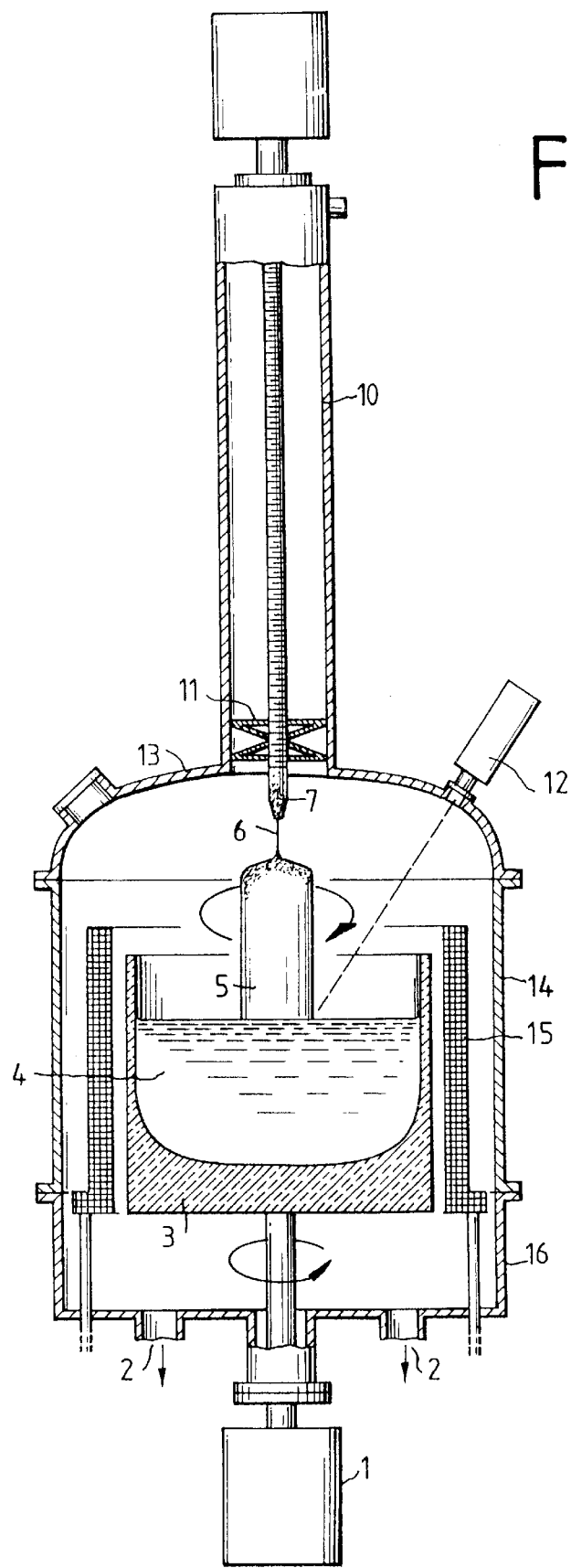
FIG. 1 shows a conventional crystal drawing system according to the Czochralski method.

The crystal drawing system according to FIG. 1 (Prior Art) is built as a 4-part vacuum vessel. It consists of a permanently installed base chamber 16 with integrated crucible drive 1 and pump connections 2 for pumping out the shield gas. A furnace chamber 14 with top-mounted chamber cover 13 can be raised or pivoted to the side. In furnace chamber. 14 the material to be melted, in a crucible 3 of quartz glass, is melted by a heater 15. Seed crystal 6 is dipped under continuous rotation into melt 4 and drawn slowly back out again through a lock chamber 10 mounted on a lock valve 11. The drawing rate in conjunction with the rotational speed and heating power determine the diameter. First, a perfect taper, the so-called neck 19, is drawn, which then passes over into a flat shoulder, which extends over the final diameter of crystal 5. An optical measuring device 12 determines the diameter on the basis of a meniscus ring 21, which is located between crystal 5 and melt 4.

Figure 2:
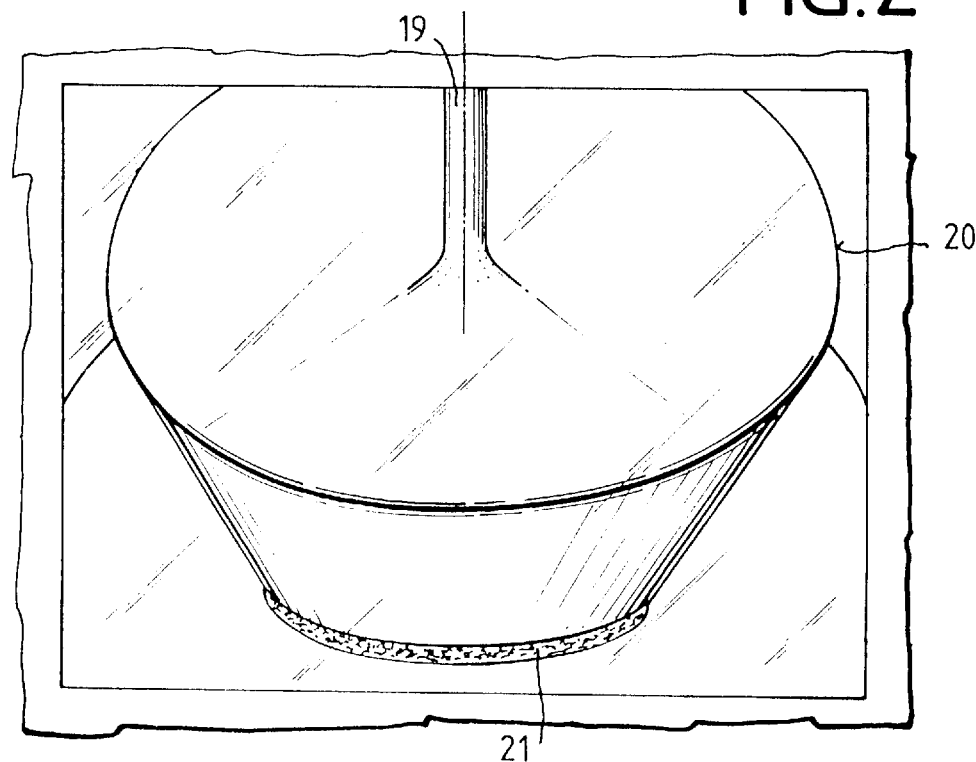
FIG. 2 shows a perspective view of the crystal viewed through the viewing window in the plane of the main crystal axis.

In FIG. 2, crystal 20 hanging from neck 19 is shown as viewed from above through a window frame 18 at an angle of approximately 25° to a vertical plane passing through the central axis. As a result of the distortion associated with the perspective view, the outer boundary areas of meniscus ring 21 are concealed by crystal 20.

Figure 3:
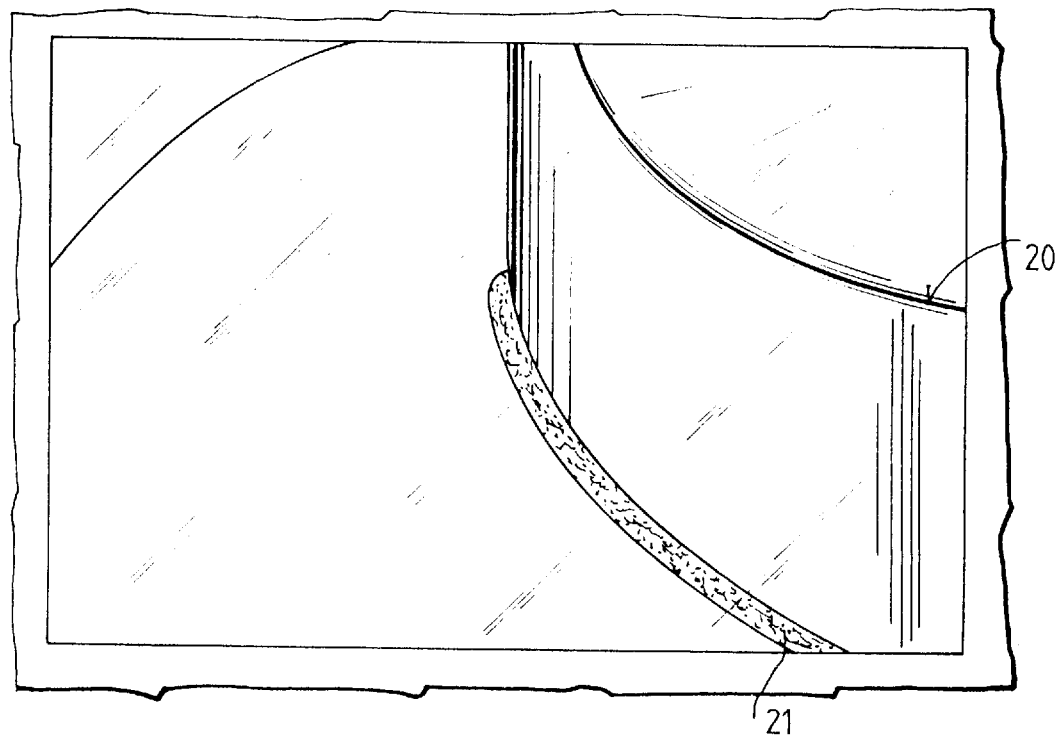
FIG. 3 shows a perspective view of the crystal as seen through the viewing window in a plane parallel to the main axis and offset by half the diameter.

FIG. 3 shows meniscus ring 21 after a lateral displacement of the viewing plane parallel to the main axis of the crystal by half the diameter, with the same viewing direction from above. Meniscus ring 21 can be observed more clearly, because the vertical edge of the lateral surface of the crystal is not concealed.

Figure 4A:
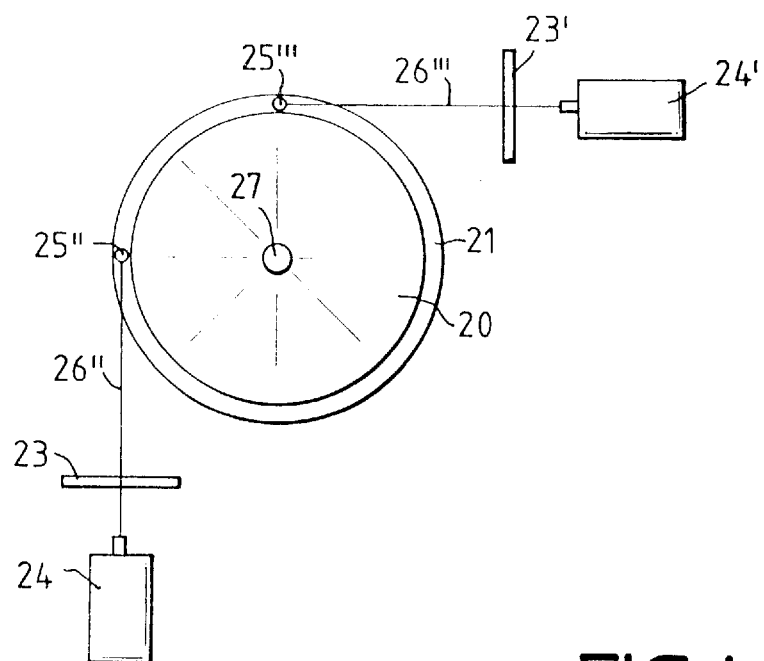
FIGS. 4a and 4b show alternative measuring apparatuses for monitoring the diameter.
Figure 4B:
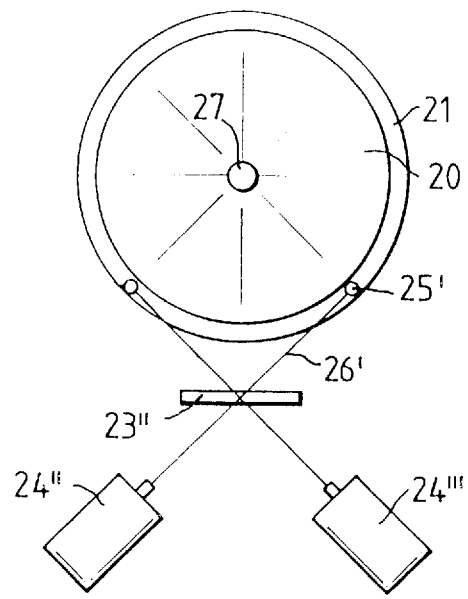

FIGS. 4a and 4b show the measuring systems in schematic fashion, where the viewing directions are projected onto an imaginary plane passing through meniscus ring 21. Two optical measuring devices in each case, e.g., pyrometers, linear or matrix cameras, video cameras 24', ring 21 through viewing windows 23, 23', 23". The arrangement according to FIG. 4b is of particular economic interest, because conventional drawing systems with one viewing window 23" can be retrofitted with the new system without the need for any modification to container 14.

We claim:

1. An apparatus for drawing crystals from a melt by the Czochralski method, said apparatus comprising a furnace chamber containing a crucible for holding a melt, means for pulling a crystal from the melt along a vertical axis so that a meniscus ring forms between the crystal and the melt, first optical viewing means for viewing a first base point on the meniscus ring along first optical path in a plane which is parallel to the vertical axis, said first optical viewing means generating a first image, second optical viewing means for viewing a second base point on the meniscus ring along a second optical path in a plane which is parallel to the vertical axis, said second optical viewing means generating a second image, said first and second base points being offset from each other on said meniscus, means for generating first and signals based on respective said first and second images, means for determining an actual diameter of the crystal based on said first and second signals, and means for controlling the actual diameter so that it conforms to a nominal diameter.

2. Apparatus as in claim 1 wherein the first and second optical paths lie in planes which are substantially tangential to the meniscus ring.

3. Apparatus as in claim 1 wherein said first and second optical paths are at an angle of 20°–30° from a vertical through the respective base points.

4. Apparatus as in claim 1 wherein said first and second optical paths are at 90° to each other.

5. Apparatus as in claim 1 wherein said first and second optical paths intersect.

6. Apparatus as in claim 5 further comprising a window in said furnace chamber, said first and second optical paths intersecting in said window.

7. Apparatus as in claim 6 wherein said first and second optical paths are at 90° to each other.

8. Apparatus as in claim 5 wherein said first and second optical paths are at 90° to each other.

* * * * *